United States Patent
Peng et al.

(10) Patent No.: US 8,734,182 B2
(45) Date of Patent: *May 27, 2014

(54) USB APPLICATION DEVICE AND METHOD FOR ASSEMBLING USB APPLICATION DEVICE

(75) Inventors: Chun-Ching Peng, Taipei (TW); Chun-Nan Su, Taipei (TW)

(73) Assignee: Primax Electronics Ltd., Taipei (TW)

( * ) Notice: Subject to any disclaimer, the term of this patent is extended or adjusted under 35 U.S.C. 154(b) by 138 days.

This patent is subject to a terminal disclaimer.

(21) Appl. No.: 13/417,011

(22) Filed: Mar. 9, 2012

(65) Prior Publication Data
US 2013/0130517 A1 May 23, 2013

(30) Foreign Application Priority Data
Nov. 18, 2011 (TW) .............................. 100142338 A

(51) Int. Cl.
*H01R 13/648* (2006.01)

(52) U.S. Cl.
USPC .................................... 439/607.01; 439/76.1

(58) Field of Classification Search
USPC ................ 439/76.1, 607.01, 607.09, 607.11, 439/607.32, 607.35, 660
See application file for complete search history.

(56) References Cited

U.S. PATENT DOCUMENTS

| | | | | | |
|---|---|---|---|---|---|
| 5,364,280 | A | * | 11/1994 | Colleran | 439/76.1 |
| 6,773,270 | B2 | * | 8/2004 | Ushio et al. | 439/76.1 |
| 7,066,742 | B2 | * | 6/2006 | Liang et al. | 439/76.1 |
| 7,118,646 | B2 | * | 10/2006 | Hunkeler | 156/293 |
| 7,892,030 | B2 | * | 2/2011 | Chang | 439/607.35 |
| 8,366,490 | B2 | * | 2/2013 | Wu | 439/660 |
| 8,366,491 | B2 | * | 2/2013 | Wu | 439/660 |
| 8,430,690 | B2 | * | 4/2013 | Su et al. | 439/607.01 |
| 2012/0040567 | A1 | * | 2/2012 | Ho | 439/660 |
| 2012/0071032 | A1 | * | 3/2012 | Tsai | 439/660 |
| 2012/0077390 | A1 | * | 3/2012 | Tsai | 439/660 |

* cited by examiner

*Primary Examiner* — Thanh Tam Le
(74) *Attorney, Agent, or Firm* — Kirton McConkie; Evan R. Witt

(57) ABSTRACT

The present invention discloses a USB application device including a body, a circuit board, a pins plate and a plurality of first electrical pins. The plurality of first electrical pins are enclosed previously by the pins plate, and a first end of each one of the plurality of first electrical pins is connected on the circuit board, so that the plurality of first electrical pins pass over a first surface of the circuit board and thus extend in suspension. The circuit board is disposed within the body and the pins plate is combined with the body, so that the plurality of first electrical pins are partly exposed by the body. The present invention also discloses a method for assembling a USB application device, which is capable of simplifying the process of disposing the plurality of first electrical pins on the circuit board.

8 Claims, 12 Drawing Sheets

USB APPLICATION DEVICE AND METHOD FOR ASSEMBLING USB APPLICATION DEVICE

FIELD OF THE INVENTION

The present invention generally relates to a transmission interface device, and more particularly to a universal serial bus (USB) application device.

BACKGROUND OF THE INVENTION

Since a USB transmission interface provides some advantages such as convenience, expandability and high transmission speed in use to users, it is popularly applied to various computer peripherals, information appliances (IAs) or 3C consumer electronics (computer, communications and consumer-electronics). Therefore, the USB transmission interface has become an indispensable transmission interface tool in work and family life to people today. Accordingly, a USB device having the USB transmission interface is popularly applied to storage or memory devices (such as flash devices, MP3 players) and wireless receivers as well.

The wireless receivers are popularly applied to computer peripheral devices, such as a mouse, a keyboard and so on, for receiving signals sent by wireless peripheral devices. The wireless receiver popularly used at present connects with a computer by using a USB transmission interface. In contrast, the wireless peripheral device is disposed with a transmitter therein. Therefore, commands of the wireless peripheral device operated by a user are capable of being sent to the receiver connecting with the computer with a form of wireless signal, and then further transmitted to the computer. As a result, the wireless peripheral device is able to be operated.

The structure of a USB device is exemplarily illustrated hereinafter by a traditional receiver. FIG. 1 illustrates an external structural view of a conventional receiver, FIG. 2 illustrates an internal structural view of a conventional receiver, and FIG. 3 illustrates a structural view of a connecting socket of a conventional receiver. Referring to FIG. 1 and FIG. 2 together first, the conventional receiver 1 comprises a circuit board 10, a body 11 and a metal case 12. The body 11 has a carrying plate 111, the circuit board 10 is disposed within the body 11 and a front end 101 of the circuit board 10 is exposed outside the body 11, and the front end 101 of the circuit board 10 is disposed on the carrying plate 111. The front end 101 of the circuit board 10 is disposed with a plurality of electrical pins 1011, 1012, 1013 and 1014, and the electrical pins 1011, 1012, 1013 and 1014 are respectively a VCC power source circuit, a GND power source circuit, a D+ data transmission circuit and a D− data transmission circuit, wherein the D+ data transmission circuit and the D− data transmission circuit are used for data transmission, while the VCC power source circuit and the GND power source circuit are used for receiving an operating circuit provided by a female connecting socket 2 (as illustrated in FIG. 3) or a power supply.

The metal case 12 encloses the front end 101 of the circuit board 10 in a manner of surrounding, so as to protect the circuit board 10. In addition, an inserting space 112 is formed between the front end 101 of the circuit board 10 and the metal 12, and thus the plurality of electrical pins 1011, 1012, 1013 and 1014 are exposed to the inserting space 112. Furthermore, the inserting space 112 is used for providing a space for fitting the conventional receiver 1 into the female connecting socket 2. In addition, the plurality of electrical pins 1011, 1012, 1013 and 1014 on the circuit board 10 connect with a plurality of connecting pins 21 of the female connecting socket 2 as illustrated in FIG. 3.

As illustrated in FIG. 2, the circuit board 10 disposed within the body 11 further comprises a control circuit 102 and a memory unit 103. The memory unit 103 is used for storing data. In addition, two ends of the control circuit 102 respectively connect with the memory unit 103 and the plurality of electrical pins 1011, 1012, 1013 and 1014 as a control device for transmitting or storing data there-between.

A portion of the body 11 of the conventional receiver 1 except the metal case 12 is defined as a holding portion, and users are capable of holding the conventional receiver 1 via the holding portion. As illustrated in FIG. 1, a length of the holding portion of the conventional receiver 1 is L1, and the length of the holding portion depends on an arrangement of various electrical elements disposed on the circuit board 10 within the body 11. In general, the conventional receiver 1 is received within the wireless peripheral device, and the holding portion of the conventional receiver 1 has a certain length, and thus the wireless peripheral device must have a certain volume for receiving the conventional receiver 1. Hence, it is difficult to meet the requirement of users about the minimization of the wireless peripheral device in volume. Except for the receiver, it is also important to users about the minimization of the USB devices applied to other fields. Accordingly, it is desired to provide a USB application device with a smaller volume.

In addition, the method for assembling the conventional receiver 1 is desired to be improved as well. Referring to FIG. 2 again, the method for assembling the conventional receiver 1 comprises the following steps. First, the plurality of electrical pins 1011, 1012, 1013 and 1014 are respectively connected with the front end 101 of the circuit board 10 by a welding technology, and the control circuit 102 and the memory unit 103 are disposed on the circuit board 10 after that. Next, the circuit board 10 is disposed within the body 11. Finally, the metal case 12 is fit onto the front end 101 of the circuit board 10. During the process of disposing the plurality of electrical pins 1011, 1012, 1013 and 1014 onto the circuit board 10, it is necessary to precisely weld each one of the electrical pins on the circuit board, and thus the locations of the plurality of electrical pins 1011, 1012, 1013 and 1014 are able to match up the locations of the plurality of connecting pins 21 of the female connecting socket 2. As a result, it is able to prevent from the problem of mismatching the plurality of electrical pins 1011, 1012, 1013 and 1014 with the plurality of connecting pins 21 when connecting the conventional receiver 1 with the female connecting socket 2. However, the above mentioned method for assembling the conventional receiver 1 is very inconvenient. Accordingly, it is desired to provide a simpler method for assembling the USB application device.

SUMMARY OF THE INVENTION

The present invention is directed to a USB application device with a smaller volume.

The present invention is further directed to a simpler method for assembling a USB application device.

In a preferred embodiment, the present invention provides a USB application device capable of fitting into a female connecting socket, wherein the female connecting socket comprises a plurality of connecting pins, and the USB application device comprises:

a body;

a circuit board, disposed within the body;

a pins plate, disposed on the body and exposed outside the body;

a plurality of first electrical pins, a first end of each one of the first electrical pins connecting with the circuit board, passing over a first surface of the circuit board and thus extending toward the pins plate in suspension, and thus the plurality of first electrical pins partly exposed by the pins plate and contacting with the plurality of connecting pins of the female connecting socket, wherein a space is formed between the pins plate and the circuit board; and a plurality of electrical elements, disposed to the first surface of the circuit board.

In a preferred embodiment, the present invention further comprises a case fitting onto the body, so as to form an inserting space between the case and the body.

In a preferred embodiment, at least one of the plurality of electrical elements is disposed within the space formed between the pins plate and the circuit board.

In a preferred embodiment, the body comprises:

a body opening, disposed on a bottom of the body, and thus a second surface of the circuit board exposed by the body opening; and a carrying portion, formed by extending from the body toward a front end of the body and having a carrying portion aperture, wherein the carrying portion aperture is capable of receiving the pins plate therein, and thus the pins plate is exposed outside the carrying portion aperture.

In a preferred embodiment, the body further comprises a hook portion disposed to a front end of the carrying portion and capable of supporting the circuit board, wherein the hook portion has an incline capable of guiding the circuit board to be put into the body.

In a preferred embodiment, at least one of the plurality of electrical elements is disposed on a second end of at least one of the plurality of first electrical pins, and the second end is partly exposed within the space formed between the pins plate and the circuit board.

In a preferred embodiment, at least one of the first electrical pins comprises an extending structure protruding from a second end of the at least one of the first electrical pins, and at least one of the plurality of electrical elements is capable of being disposed thereon.

In a preferred embodiment, at least one of the first end and a second end of each one of the first electrical pins is mounted on the first surface of the circuit board by a surface mounted technology or a soldering technology.

In a preferred embodiment, at least one of the plurality of first electrical pins comprises a first fixing segment, a second fixing segment, a first extending segment, a second extending segment and a contacting segment. The first fixing segment is the first end of each one of the first electrical pins, and the second fixing segment is a second end of each one of the first electrical pins. Both of the first extending segment and the second extending segment are located between the first surface of the circuit board and the body, and a first surface of the contacting segment is exposed by the body. The first surface of the contacting segment is capable of contacting with the connecting pins. A first bending structure is formed between the first extending segment and the contacting segment, while a second bending structure is formed between the second extending segment and the contacting segment, wherein the pins plate encloses the first extending segment and the second extending segment, while the pins plate partly encloses the contacting segment.

In a preferred embodiment, the circuit board comprises a plurality of extending wires, and each one of the extending wires corresponds to one of the first electrical pins. Both of each one of the first fixing segments and each one of the second fixing segments connect with the circuit board and are adjacent to a front end of the circuit board, while each one of the extending wires connects with at least one of the corresponding one of the first fixing segments and the corresponding one of the second fixing segments and disposed along a direction extending toward a rear end of the circuit board, wherein the extending wires are directly formed on the circuit board.

In a preferred embodiment, at least one of the plurality of first electrical pins comprises a fixing segment, a first extending segment, a second extending segment, a contacting segment and an incurvation segment. The fixing segment is the first end of at least one of the first electrical pins, and the incurvation segment is a second end of the at least one of the first electrical pins and partly exposed within the space formed between the pins plate and the circuit board without connecting with the circuit board. Both of the first extending segment and the second extending segment are located between the first surface of the circuit board and the body, and a first surface of the contacting segment is exposed by the body, wherein the first surface of the contacting segment is capable of contacting with the connecting pins. A first bending structure is formed between the first extending segment and the contacting segment, a second bending structure is formed between the second extending segment and the contacting segment, while a third bending structure is formed between the second extending segment and the incurvation segment, wherein the pins plate encloses the first extending segment and the second extending segment, while the pins plate partly encloses the contacting segment and the incurvation segment.

In a preferred embodiment, the circuit board comprises a plurality of extending wires, and each one of the extending wires corresponds to one of the first electrical pins. Each of the fixing segments connects with the circuit board and is adjacent to a front end of the circuit board, while each one of the extending wires connects with the corresponding one of the fixing segments and is disposed along a direction extending toward a rear end of the circuit board, wherein the extending wires are directly formed on the circuit board.

In a preferred embodiment, the USB application device of the present invention further comprises a plurality of second electrical pins disposed on the first surface of the circuit board and capable of contacting with a plurality of another connecting pins of the female connecting socket, wherein the plurality of first electrical pins form as a USB 2.0 transmission interface, while the plurality of first electrical pins and the plurality of second electrical pins form as a USB 3.0 transmission interface together.

In a preferred embodiment, the USB application device of the present invention further comprises a plurality of third electrical pins disposed on a second surface of the circuit board and capable of contacting with the plurality of connecting pins of the female connecting socket, wherein the plurality of third electrical pins form as another USB 2.0 transmission interface, and thus both side of the USB application device are able to be plugged in.

In a preferred embodiment, the pins plate partly enclosing the plurality of first electrical pins is formed by an embedded injection molding technology, and thus the pins plate partly encloses the plurality of the first electrical pins.

In a preferred embodiment, the present invention further provides a method for assembling a USB application device, wherein the USB application device comprises a body and a circuit board, and the method comprises:

providing a pins plate, and the pins plate partly enclosing a plurality of first electrical pins;

disposing a plurality of electrical elements and a plurality of first electrical pins on the circuit board, wherein a first end of each one of the first electrical pins connects with the circuit board, and each one of the first electrical pins passes over a first surface of the circuit board and thus extends in suspension, so as to form a space between the pins plate and the circuit board; and disposing the circuit board within the body and combining the pins plate with the body, so that the plurality of first electrical pins are partly exposed by the body.

In a preferred embodiment, the first end of each one of the first electrical pins disposed on the circuit board is mounted on the first surface of the circuit board by a surface mounted technology or a soldering technology.

In a preferred embodiment, the circuit board comprises a plurality of extending wires, and each one of the extending wires corresponds to one of the first electrical pins. In the step of disposing the plurality of electrical elements and the plurality of first electrical pins on the circuit board, the first end of each one of the first electrical pins connects with the circuit board and is adjacent to a front end of the circuit board, while each one of the extending wires connects with the corresponding one of the first end and is disposed along a direction extending toward a rear end of the circuit board, wherein the extending wires are directly formed on the circuit board.

In a preferred embodiment, the pins plate partly enclosing the plurality of first electrical pins is formed by an embedded injection molding technology.

In a preferred embodiment, the body comprises a bottom and a carrying portion, and the carrying portion has a carrying portion aperture. In addition, the step of disposing the circuit board within the body comprises:

inserting the circuit board into the bottom of the body, and thus a second end of the circuit board passing through the bottom and being put into the body; and turning a first end of the circuit board over, and thus the first end of the circuit board passing through the bottom and located within the body, and putting the pins plate into the carrying portion aperture, so as to combine the pins plate with the body, and thus the plurality of first electrical pins partly exposed by the body.

In a preferred embodiment, the body comprises a hook portion and the hook portion has an incline. In addition, the step of turning the first end of the circuit board over comprises contacting the first end of the circuit board with the hook portion and then turning the first end over along the incline of the hook portion, so as to locate the first end of the circuit board within the body.

In a preferred embodiment, the body comprises a bottom, a carrying portion and a plurality of column structures, and the carrying portion has a carrying portion aperture. In addition, the step of disposing the circuit board within the body comprises:

inserting the circuit board into the bottom of the body, and putting the pins plate into the carrying portion aperture to combine the pins plate with the body, and thus the plurality of first electrical pins partly exposed by the body; and heating the plurality of column structures, so as to form the plurality of column structures as a plurality of hook structures by melt deformation, and thus the circuit board is fastened within the body.

In a preferred embodiment, the method further comprises fitting a case onto the body after disposing the circuit board within the body.

In a preferred embodiment, the method further comprises disposing at least one of the plurality of electrical elements within the space formed between the pins plate and the circuit board when disposing the plurality of electrical elements and the plurality of first electrical pins on the circuit board.

In a preferred embodiment, the method further comprises disposing at least one of the plurality of electrical elements to a second end of at least one of the plurality of first electrical pins after providing the pins plate and the pins plate partly enclosing the plurality of first electrical pins.

In a preferred embodiment, the method further comprises disposing at least one of the plurality of electrical elements to a location adjacent to a second end of at least one of the plurality of first electrical pins after providing the pins plate and the pins plate partly enclosing the plurality of first electrical pins.

DETAILED DESCRIPTION OF THE PREFERRED EMBODIMENT

Figure 4:
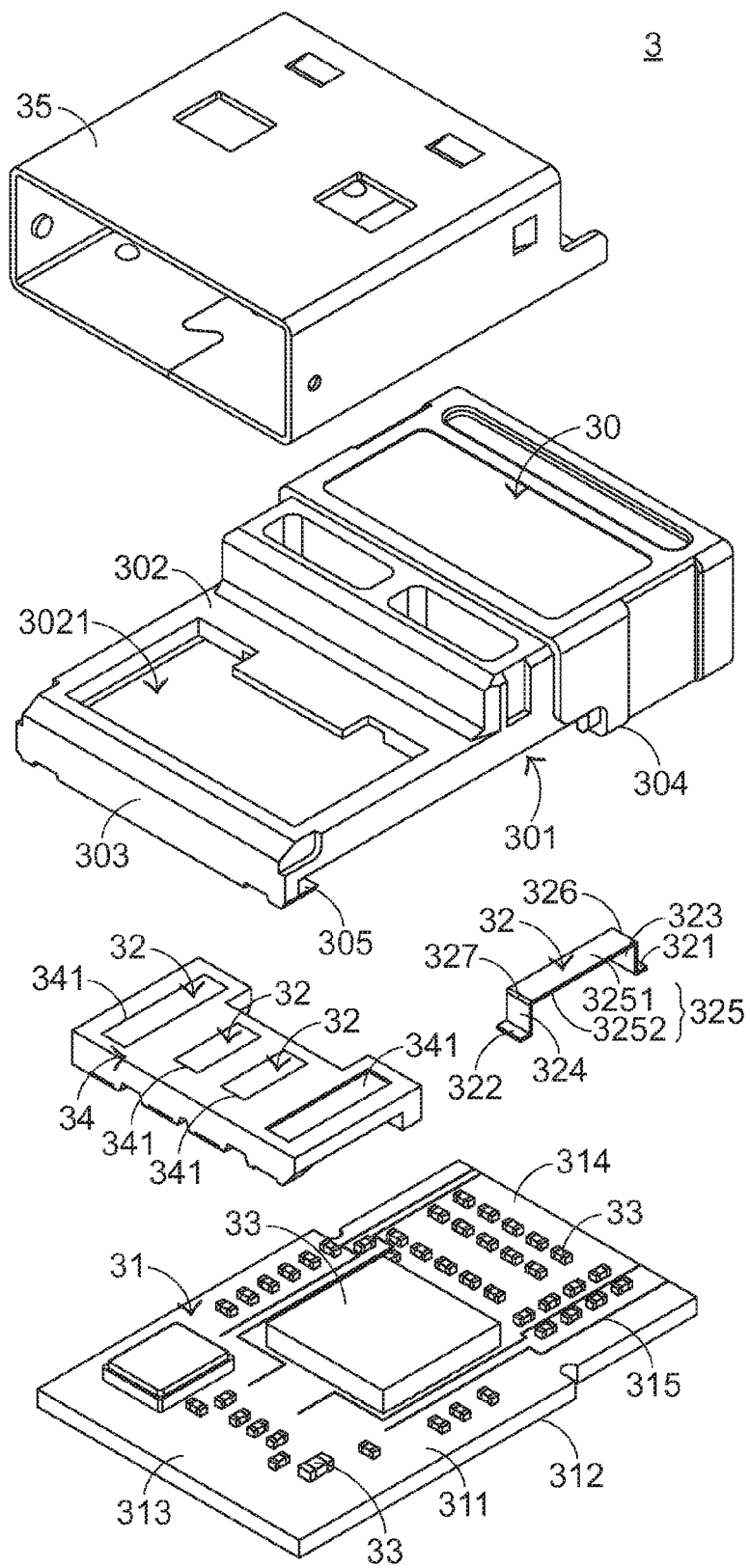
FIG. 4 illustrates a structural explosion view of a USB application device according to a first preferred embodiment of the present invention.

The present invention provides a USB application device. FIG. 4 illustrates a structural explosion view of a USB application device according to a first preferred embodiment of the present invention. Referring to FIG. 4, the USB application device 3 comprises a body 30, a circuit board 31, a plurality of first electrical pins 32, a plurality of electrical elements 33, a pins plate 34 and a case 35. The body 30 comprises a body opening 301, a carrying portion 302 and a hook portion 305, wherein the body opening 301 is disposed on a bottom 304 of the body 30, and thus a second surface 312 of the circuit board 31 is exposed by the body opening 301, while the carrying portion 302 is formed by extending from the body 30 toward a front end 303 of the body 30, and the carrying portion 302 has a carrying portion aperture 3021. The hook portion 305 is disposed to a front end 3022 of the carrying portion 302, and the hook portion 305 has an incline 3051. The circuit board 31 comprises a plurality of extending wires 315. Each of the extending wires 315 corresponds to one of the first electrical pins 32, and each one of the extending wires 315 is located on a first surface 311 of the circuit board 31 and disposed along a direction extending toward a second end 314 of the circuit board 31, wherein the plurality of extending wires 315 are directly formed on the first surface 311 of the circuit board 31. In the present preferred embodiment, the first surface 311 is the upper surface of the circuit board 31, the second surface 312 is the lower surface of the circuit board 31, and the second end 314 is the rear end of the circuit board 31.

The plurality of electrical elements 33 are disposed to the first surface 311 of the circuit board 31. In addition, the pins plate 34 has a plurality of pins plate apertures 341 corresponding to the plurality of first electrical pins 32, wherein each one of the first electrical pins 32 is partly enclosed by the pins plate 34 and partly exposed outside the pins plate 34 by the corresponding one of the pins plate apertures 341. In each one of the first electrical pins 32, a first end 321 of each one of the first electrical pins 32 connects with the circuit board 31, passes over the first surface 311 of the circuit board 31 and extends toward the pins plate 34 in suspension, i.e. extends toward where over the circuit board 31, and a second end 322 of each one of the first electrical pins 32 connects with the circuit board 31 as well. Therefore, each one of the first electrical pins 32 crosses over at least one electrical element 33 of the plurality of electrical elements 33 on the circuit board 31. In another word, a space 36 is formed between the pins plate 34 partly enclosing each one of the first electrical pins 32 and the circuit board 31 (referring to FIG. 6), and thus at least one electrical element 33 of the plurality of electrical elements 33 can be disposed within the space 36. In the present preferred embodiment, the pins plate 34 partly enclosing the plurality of first electrical pins 32 is formed by putting the plurality of first electrical pins 32 within a mold cavity to process an embedded injection molding technology, and the first ends 321 of the first electrical pins 32 and the second ends 322 of the first electrical pins 32 are exposed without being enclosed. Herein, the first ends 321 of the first electrical pins 32 are the front ends of the first electrical pins 32, while the second ends 322 of the first electrical pins 32 are the rear ends of the first electrical pins 32.

Moreover, the case 35 is capable of protecting the circuit board 31. In the present preferred embodiment, the case 35 is made of metal materials. However, in other present preferred embodiment, the case can also be made of plastic materials.

Figure 5:
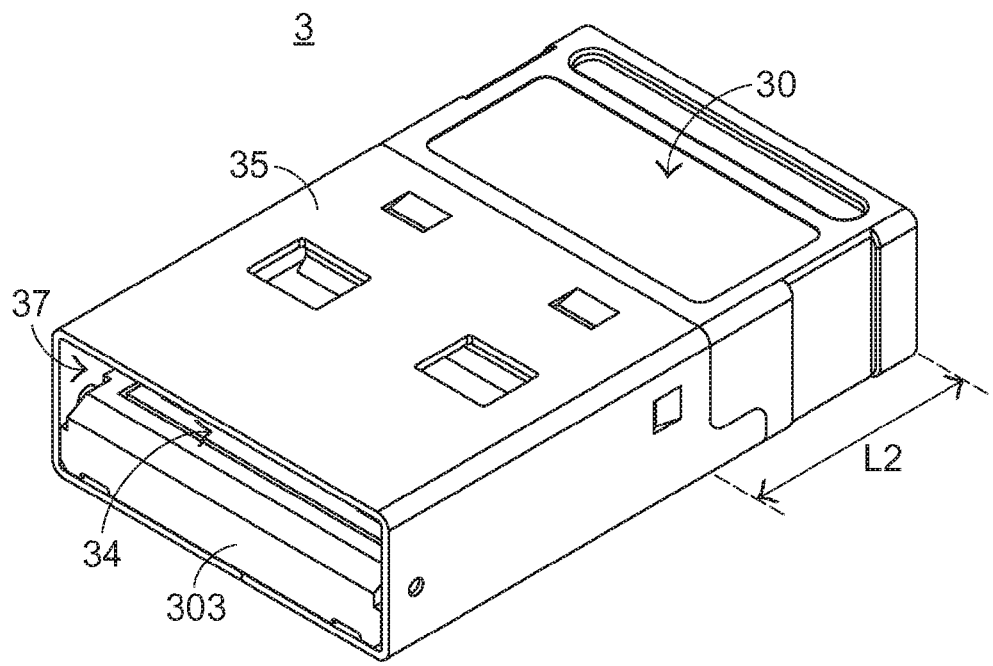
FIG. 5 illustrates an external structural view of a USB application device according to a first preferred embodiment of the present invention.
Figure 6:
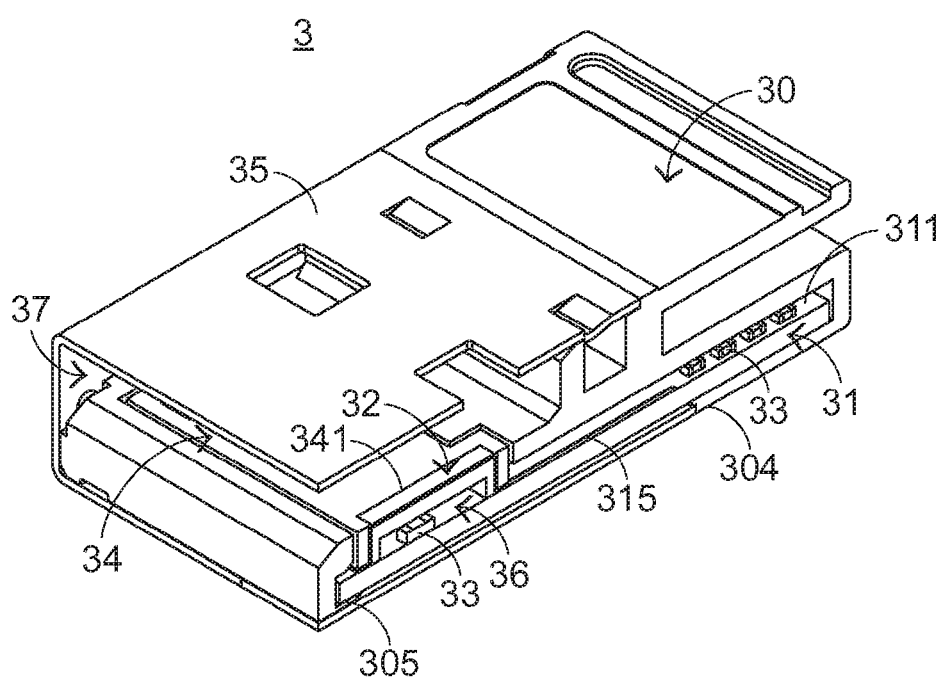
FIG. 6 illustrates a structural cross-sectional view of a USB application device according to a first preferred embodiment of the present invention.

The combination of all of the above mentioned elements is illustrated in FIG. 5 and FIG. 6, wherein FIG. 5 illustrates an external structural view of a USB application device according to a first preferred embodiment of the present invention, and FIG. 6 illustrates a structural cross-sectional view of a USB application device according to a first preferred embodiment of the present invention. Referring to FIG. 5 and FIG. 6 together, the circuit board 31 is disposed within the body 30, and the pins plate 34 is put into the carrying portion aperture 3021 to combine the pins plate 34 with the body 30. Therefore, the pins plate 34 is exposed outside the carrying portion aperture 3021, and thus the plurality of first electrical pins 32, which is partly enclosed by the pins plate 34, can be partly exposed outside the body 30. In addition, the case 35 is fitting onto the body 30, so as to form an inserting space 37 between the case 35 and the body 30, wherein the inserting space 37 is used for fitting the USB application device 3 into the female connecting socket 2 (referring to FIG. 3), so as to contact the plurality of exposed first electrical pins 32 with the plurality of connecting pins 21 of the female connecting socket 2 (referring to FIG. 3).

As illustrated in FIG. 6, the hook portion 305 of the body 30 is disposed to the front end 3022 of the carrying portion 302 and capable of supporting the circuit board 31, so as to prevent the circuit board 31 from sliding out of the bottom 304 of the body 30. In addition, the incline 3051 of the hook portion 305 is capable of guiding the circuit board 31 to be put into the body 30 from the bottom 304 of the body 30.

In the present preferred embodiment, each one of the first electrical pins 32 is defined as a first fixing segment 321 (i.e. the first end thereof), a second fixing segment 322 (i.e. the second end thereof), a first extending segment 323, a second extending segment 324 and a contacting segment 325. Both of the first fixing segment 321 and the second fixing segment 322 are exposed outside the pins plate 34 and are mounted on the circuit board 31 by a surface mounted technology (SMT), and the first fixing segment 321 and the second fixing segment 322 are adjacent to a first end 313 of the circuit board 31, wherein the first end 313 is the front end of the circuit board 31. The first extending segment 323 and the second extending segment 324 are enclosed by the pins plate 34 and located between the first surface 311 of the circuit board 31 and the body 30. In addition, the contacting segment 325 is partly enclosed in the pins plate 34. In another word, a first surface 3251 of the contacting segment 325 is exposed by the carrying portion aperture 3021 of the body 30 via the corresponding pins plate aperture 341, and a second surface 3252 of the contacting segment 325 is enclosed within the pins plate 34. In the preset preferred embodiment, a first bending structure 326 is formed between the first extending segment 323 and the contacting segment 325, while a second bending structure 327 is formed between the second extending segment 324 and the contacting segment 325, and the first bending structure 326 and the second bending structure 327 connect with the contacting segment 325 with an angle close to perpendicular or equal to perpendicular. In a word, the plurality of first electrical pins 32 form as a USB 2.0 transmission interface. In another word, the plurality of first electrical pins 32 may be used as a male plug contacting portion, and the plurality of connecting pins 21 of the female connecting socket 2 used for connecting with the plurality of first electrical pins 32 form as a USB 2.0 transmission interface as well, and thus it is able to transmit data there-between.

It should be noted that, in the present preferred embodiment, the first end 321 of each one of the first electrical pins 32 is mounted on the circuit board 31 by the surface mounted technology, passes over the first surface 311 of the circuit board 31 and extends toward the pins plate 34, and the first end 321 of each one of the first electrical pins 32 connects with the corresponding extending wire 315. In addition, the second end 322 of each one of the first electrical pins 32 is mounted on the circuit board 31 by the surface mounted technology as well. However, in other preferred embodiments, at least one of the first end 321 and the second end 322 of each one of the first electrical pins 32 can be mounted on the first surface 311 of the circuit board 31 by a soldering technology.

Figure 7:
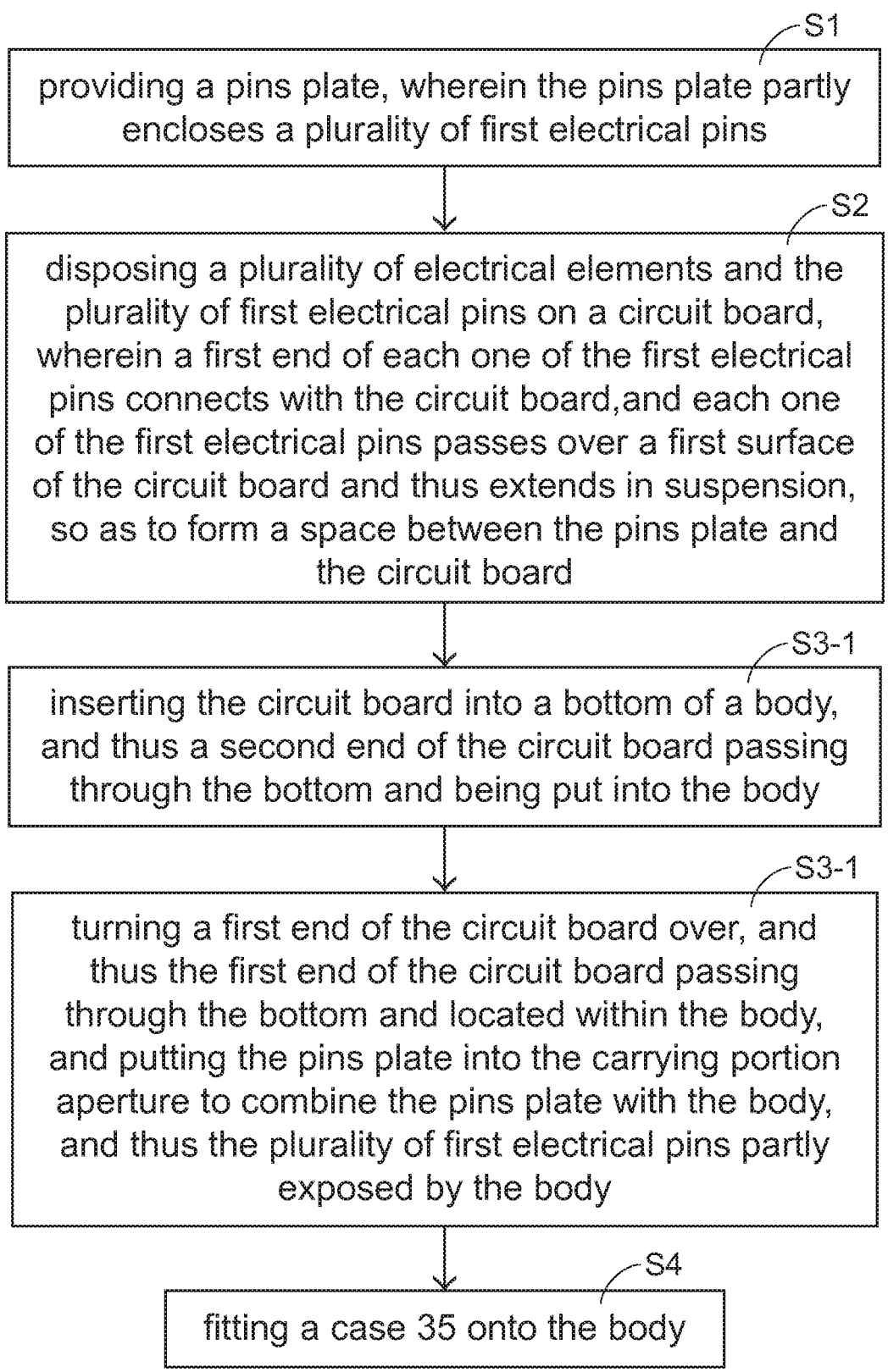
FIG. 7 illustrates a block diagram of a method for assembling a USB application device according to a first preferred embodiment of the present invention.
Figure 8A:
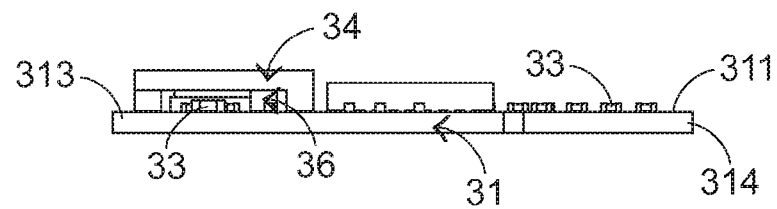
FIG. 8A to FIG. 8D illustrate a structural side view of assembling a USB application device according to a first preferred embodiment of the present invention.
Figure 8B:
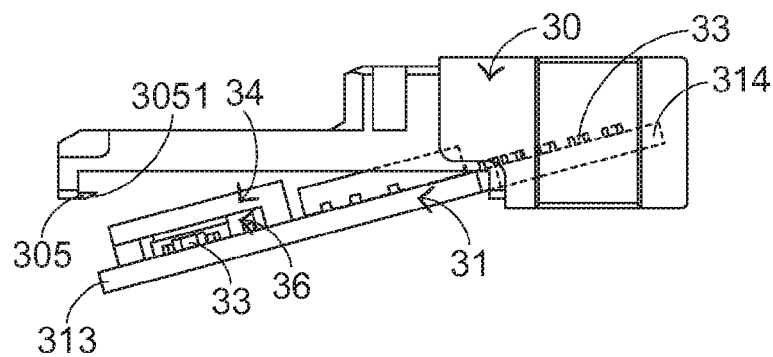
Figure 8C:
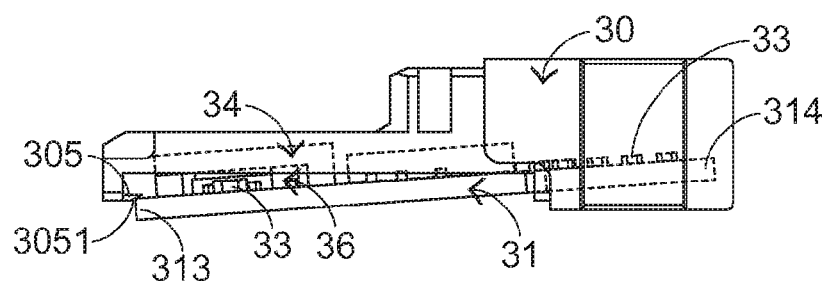
Figure 8D:
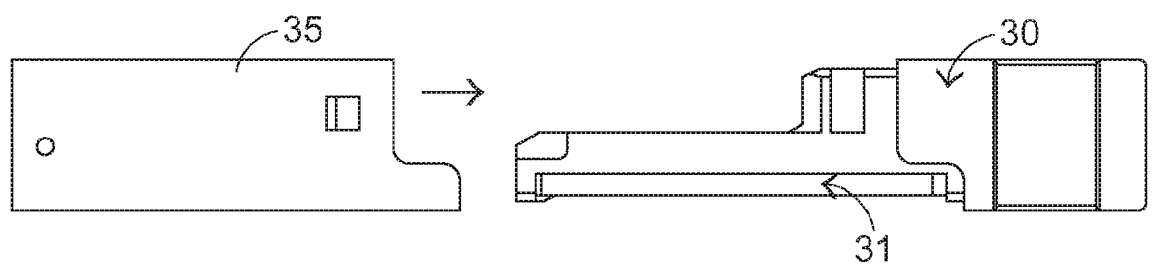

FIG. 7 illustrates a block diagram of a method for assembling a USB application device according to a first preferred embodiment of the present invention, while FIG. 8A to FIG. 8D illustrate a structural side view of assembling a USB application device according to a first preferred embodiment of the present invention. Referring to FIG. 7 and FIG. 8A to FIG. 8D together, the method for assembling the USB application device 3 comprises the following steps. A step S1 is providing a pins plate 34, wherein the pins plate 34 partly encloses a plurality of first electrical pins 32 as illustrated in FIG. 4. A step S2 is disposing a plurality of electrical elements 33 and a plurality of first electrical pins 32 on the circuit board 31, wherein a first end 321 of each one of the first electrical pins 32 connects with the circuit board 31, and each one of the first electrical pins 32 passes over a first surface 311 of the circuit board 31 and thus extends in suspension, so as to form a space 36 between the pins plate 34 and the circuit board 31 as illustrated in FIG. 8A. A step S3 is disposing the circuit board 31 within the body 30 and combining the pins plate 34 with the body 30, so that the plurality of first electrical pins 32 being partly exposed by the body 30. In addition, a step S4 is fitting a case 35 onto the body 30 as illustrated in FIG. 8D. In the present embodiment, the step S3 can further comprise a step S3-1 and a step S3-2. Herein, the step S3-1 is inserting the circuit board 31 into the bottom 304 of the body 30, and thus a second end 314 of the circuit board 31 passing through the bottom 304 and being put into the body 30 as illustrated in FIG. 8B. In addition, the step S3-2 is turning a first end 313 of the circuit board 31 over, and thus the first end 313 of the circuit board 31 passing through the bottom 304 and located within the body 30, and putting the pins plate 34 into the carrying portion aperture 3021 to combine the pins plate 34 with the body 30, and thus the plurality of first electrical pins 32 partly exposed by the body 30.

In the step S1, a combination of the pins plate 34 and the plurality of first electrical pins 32 is formed by an embedded injection molding technology, and thus the pins plate 34 is partly enclosing the plurality of first electrical pins 32. In the step S2, the first ends 321 of the plurality of first electrical pins 32 are mounted on the first surface 311 of the circuit board 31 by a surface mounted technology, and the plurality of electrical elements 33 are mounted on the first surface 311 of the circuit board 31 by the surface mounted technology as well. Herein, at least one electrical element 33 of the plurality of electrical elements 33 is disposed within the space 36 formed between the pins plate 34 and the first surface 311 of the circuit board 31. In addition, in the step S3-2, the first end 313 of the circuit board 31 contacts with the hook portion 305 and the first end 313 thereof is turned over along an incline 3051 of the hook portion 305, and thus the first end 313 of the circuit board 31 is located within the body 30 as illustrated in FIG. 8C.

There are three points need to be specified. First, since each one of the plurality of first electrical pins 32 is designed with the first extending segment 323 and the second extending segment 324, heights of the plurality of first electrical pins 32 are enhanced and each one of the plurality of first electrical pins 32 forms as a three-dimensional structure. Therefore, the space 36 is formed between the pins plate 34 partly enclosing the plurality of first electrical pins 32 and the circuit board 31, and the space 36 can use to dispose with the plurality of electrical elements 33 or contain other structures. Hence, an area of the first end 313 (i.e. the front end) of the circuit board 31 available for use may be increased, and thus a required area of the second end 314 (i.e. the rear end) of the circuit board 31 is reduced, such that the second end 314 of the circuit board 31 can be cut for reducing the length of the circuit board 31. Accordingly, a length of the holding portion of the USB application device 3 can be reduced, and the length thereof is L2 (as illustrated in FIG. 5), and thus a volume of the USB application device 3 can be reduced as well.

Second, as illustrated in FIG. 4, although the electrical interference is avoidable by separating the first electrical pins 32 and the electrical elements 33, the present invention does not intent to limit to separate the first electrical pins 32 and the electrical elements 33. In another word, the first electrical pins can also be designed to contact with the electrical elements according to some specific requirements. For example, the first electrical pins can be grounded by contacting the first electrical pins with the electrical elements when the first electrical pins must be grounded. Therefore, an adaptability of a circuit layout of the USB application device of the present invention is able to be enhanced by the structure of the first electrical pins. Third, in the present preferred embodiment, the plurality of extending wires 315 are exposed by the first surface 311 of the circuit board 31. In other preferred embodiments, however, the plurality of extending wires can be disposed within the circuit board, and the arrangement of the plurality of extending wires disposed within the circuit board can further be applied to a multi-layer circuit board structure.

Figure 9:
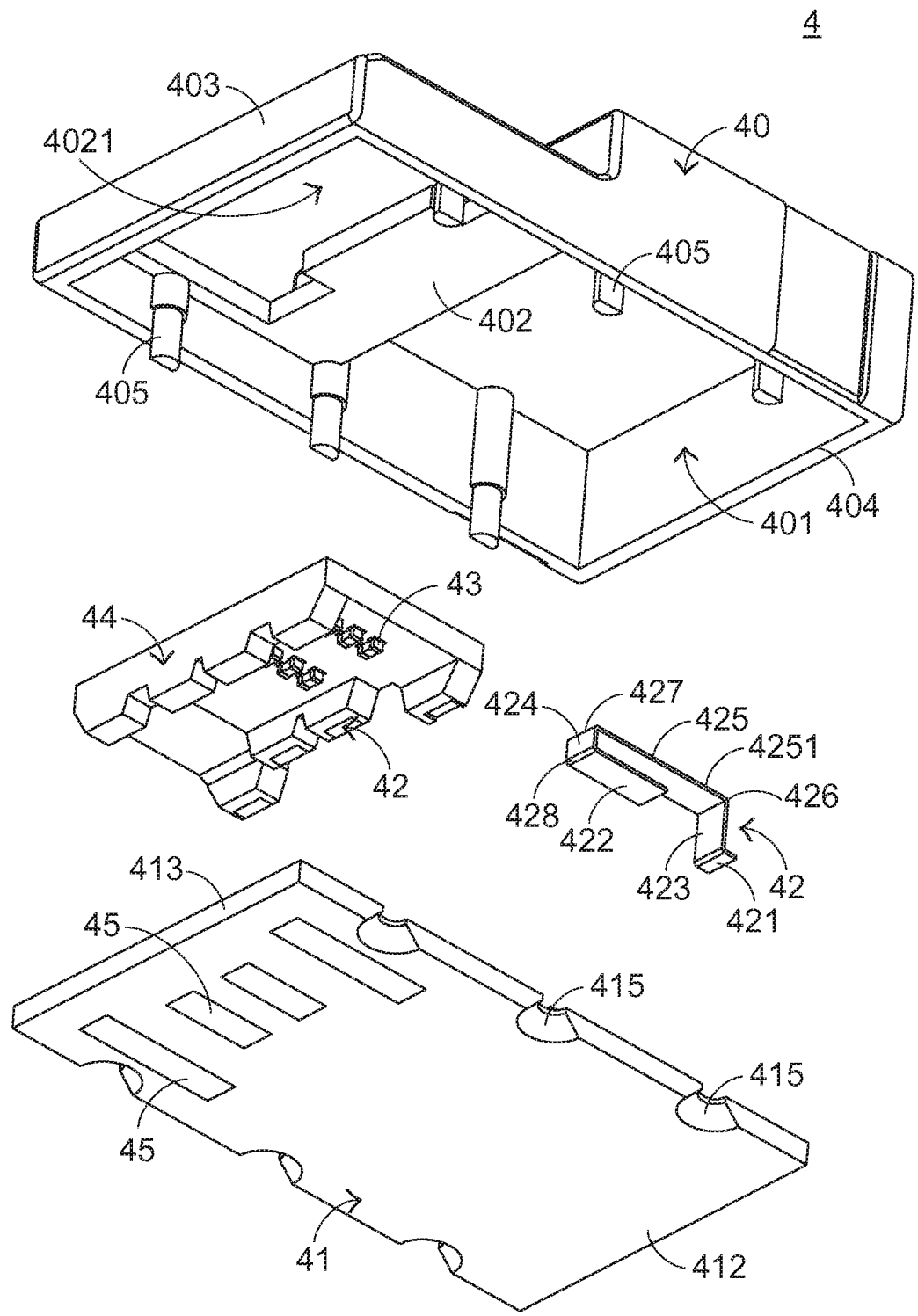
FIG. 9 illustrates a structural explosion view of a USB application device from another angle of view according to a second preferred embodiment of the present invention.

In addition, the present invention further provides a second preferred embodiment. FIG. 9 illustrates a structural explosion view of a USB application device from another angle of view according to a second preferred embodiment of the present invention. Referring to FIG. 9, the USB application device 4 comprises a body 40, a circuit board 41, a plurality of first electrical pins 42, a plurality of electrical elements 43, a pins plate 44 and a plurality of third electrical pins 45. The body 40 comprises a body opening 401, a carrying portion 402 and a plurality of column structures 405. The body opening 401 is disposed on a bottom 404 of the body 40, so that a second surface 412 of the circuit board 41 is exposed by the body opening 401. In addition, the carrying portion 402 is formed by extending from the body 40 toward a front end 403 of the body 40, and the carrying portion 402 has a carrying portion aperture 4021. Furthermore, the plurality of column structures 405 are disposed at two opposite sides of a bottom 404 of the body 40, and the circuit board 41 has a plurality of notches 415. The plurality of notches 415 correspond to the plurality of column structures 405, and thus the circuit board 41 is capable of being directly inserted into the body 40 from the bottom 404 of the body 40 by matching up the plurality of notches 415 and the plurality of column structures 405.

Figure 13A:
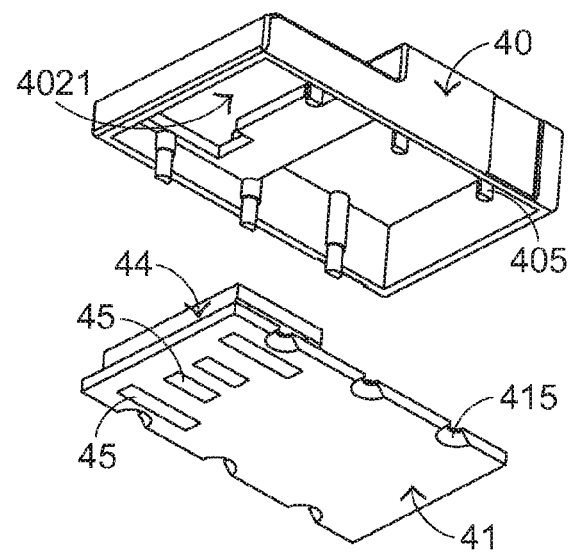
FIG. 13A to FIG. 13C illustrate a structural side view of assembling a USB application device according to a second preferred embodiment of the present invention.
Figure 13B:
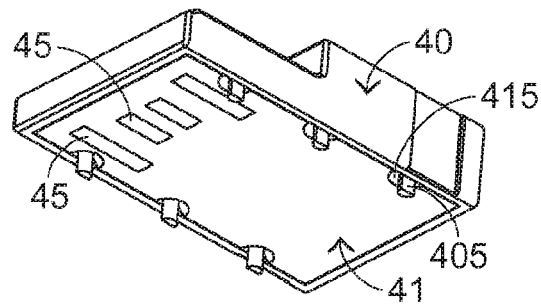
Figure 13C:
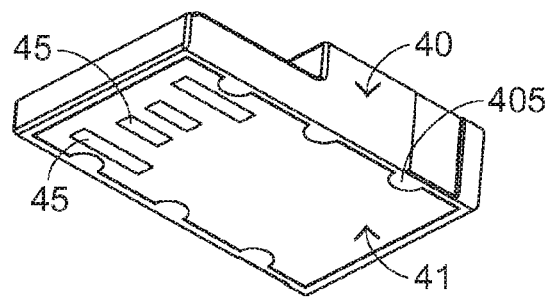

When the circuit board 41 is located within the body 40, the plurality of column structures 405 can be heated, so as to form the plurality of column structures 405 as a plurality of hook structures 405 by melt deformation. Herein, the plurality of hook structures 405 hook the circuit board 41 from the bottom side of the circuit board 41, and thus the circuit board 41 is fastened within the body 40 as illustrated in FIG. 13C. Besides, the plurality of extending wires 414 (referring to FIG. 11) on the circuit board 41 are similar to those of the first preferred embodiment and thus are omitted herein.

Figure 10:
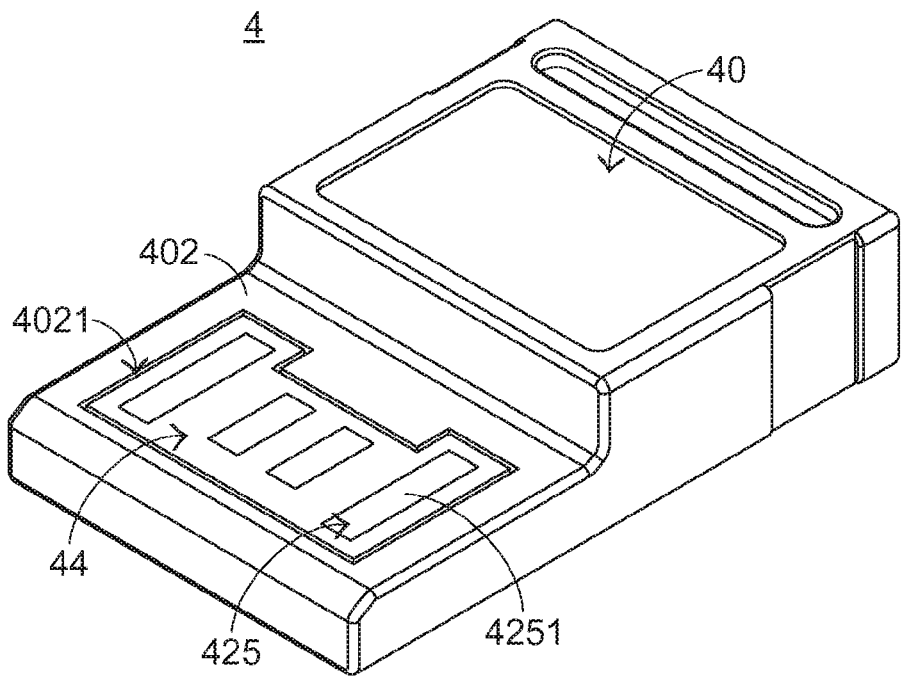
FIG. 10 illustrates an external structural view of a USB application device according to a second preferred embodiment of the present invention.
Figure 11:
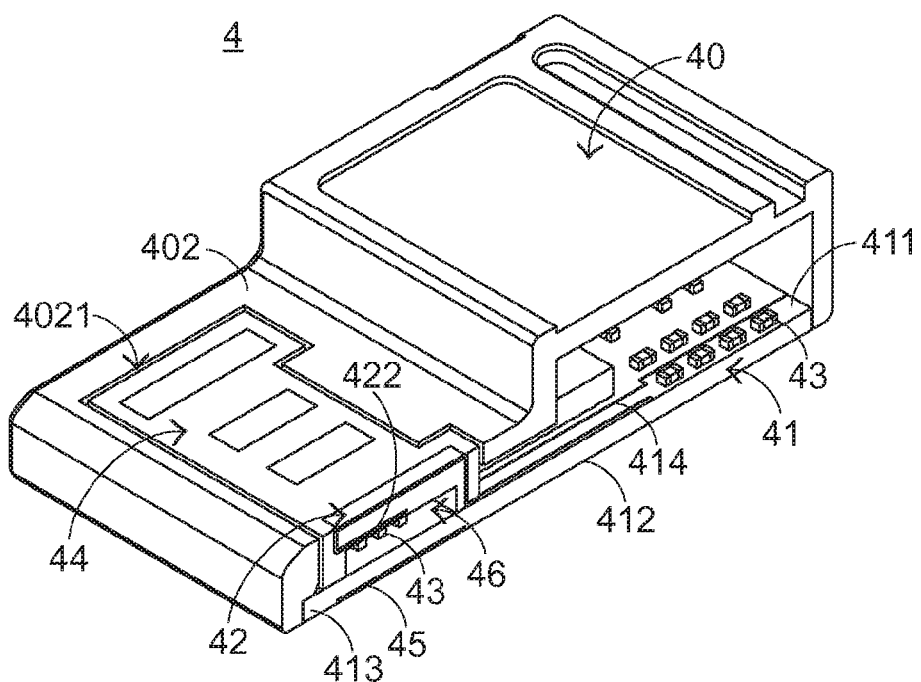
FIG. 11 illustrates a structural cross-sectional view of a USB application device according to a second preferred embodiment of the present invention.

The combination of all of the above mentioned elements is illustrated hereinafter. FIG. 10 illustrates an external structural view of a USB application device according to a second preferred embodiment of the present invention, and FIG. 11 illustrates a structural cross-sectional view of a USB application device according to a second preferred embodiment of the present invention. Referring to FIG. 10 and FIG. 11 together, the circuit board 41 is disposed within the body 40, and the pins plate 44 are put into the carrying portion aperture 4021, so as to combine the pins plate 44 with the body 40. As a result, the pins plate 44 is exposed outside the carrying portion aperture 4021, and thus the plurality of first electrical pins 42, which are partly enclosed by the pins plate 44, can be partly exposed outside the body 40. Since there is no case fitted onto the body 40, the plurality of first electrical pins 42, which are partly exposed by the body 40, can contact with the plurality of connecting pins 21 (referring to FIG. 3) of the female connecting socket 2 when the USB application device 4 is fitted into the female connecting socket 2 (referring to FIG. 3). In another word, the USB application device 4 is a thin type USB application device.

In the present preferred embodiment, each one of the first electrical pins 42 of the USB application device 4 is defined as a first fixing segment 421 (i.e. the first end thereof), an incurvation segment 422 (i.e. the second end thereof), a first extending segment 423, a second extending segment 424 and a contacting segment 425. The first fixing segment 421 is mounted on a first surface 411 of the circuit board 41 by a welding technology and adjacent to the first end 413 of the circuit board 41, while the first extending segment 423 and the second extending segment 424 are located between the first surface 411 of the circuit board 41 and the pins plate 44. A first surface 4251 of the contacting segment 425 is exposed by the body 40, and thus the first surface 4251 of the contacting segment 425 is able to contact with the connecting pins 21 of the female connecting socket 2 (referring to FIG. 3). In addition, a first bending structure 426 is formed between the first extending segment 423 and the contacting segment 425, while a second bending structure 427 is formed between the second extending segment 424 and the contacting segment 425, wherein the first bending structure 426 and the second bending structure 427 connect with the contacting segment 425 with an angle close to perpendicular or equal to perpendicular. Moreover, the incurvation segment 422 is formed by extending from the second extending segment 424 without connecting with the circuit board 41. Furthermore, the incurvation segment 422 is partly exposed within a space 46 formed between the pins plate 44 and the circuit board 41, and thus at least one electrical element 44 of the plurality of electrical elements 44 is able to be disposed on the incurvation segment 422 (i.e. the second end 422 of the first electrical pin 42). Herein, a third bending structure 428 is formed between the second extending segment 424 and the incurvation segment 422. According to FIG. 12, it is able to be understood that the pins plate 44 encloses the first extending segment 423 and the second extending segment 424, while the pins plate 44 partly encloses the contacting segment 425 and the incurvation segment 422.

Figure 1:
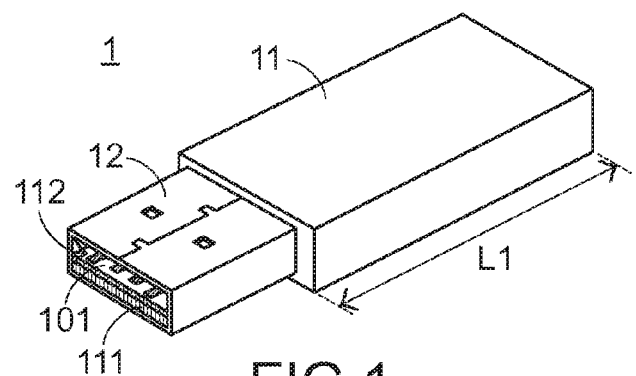
FIG. 1 illustrates an external structural view of a conventional receiver.
Figure 2:
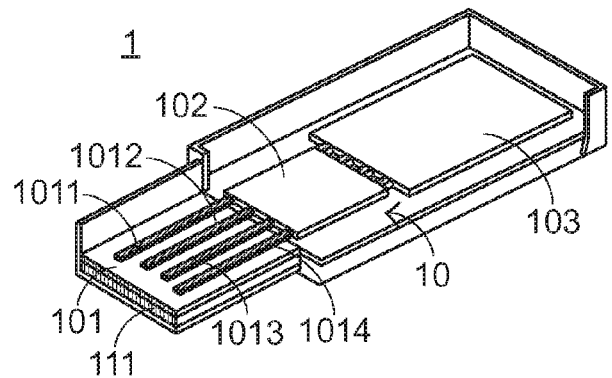
FIG. 2 illustrates an internal structural view of a conventional receiver.
Figure 3:
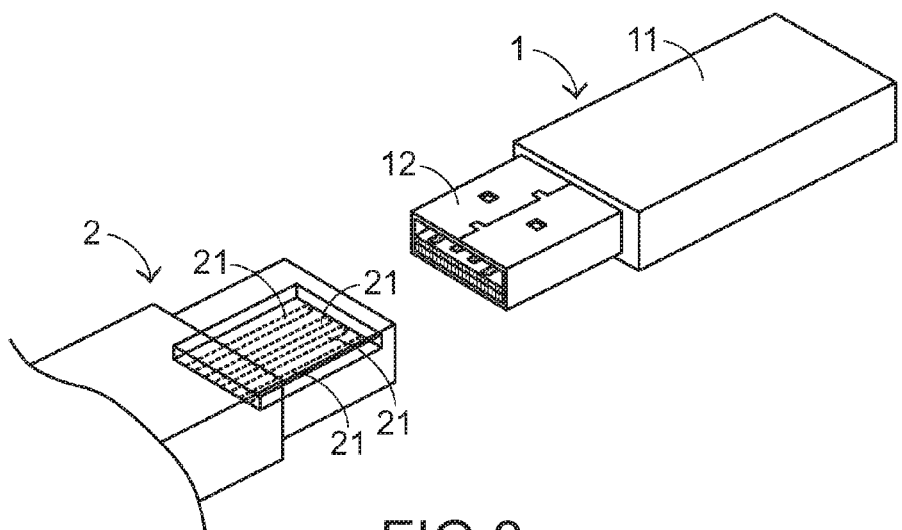
FIG. 3 illustrates a structural view of a connecting socket of a conventional receiver.

As illustrated in FIG. 11, the USB application device 4 further comprises a plurality of third electrical pins 45, wherein the plurality of third electrical pins 45 are disposed on a second surface 412 of the circuit board 41, and the plurality of third electrical pins 45 are capable of contacting with the plurality of connecting pins 21 of the female connecting socket 2 (referring to FIG. 3). Therefore, the plurality of third electrical pins 45 form as another USB 2.0 transmission interface, so that either the plurality of first electrical pins 42 or the plurality of third electrical pins 45 can contact with the plurality of connecting pins 21 for transmitting data therebetween. In a word, both side of the USB application device 4 are able to be plugged in. Besides, other structures are similar to those of the first preferred embodiment and thus are omitted herein.

Figure 12:
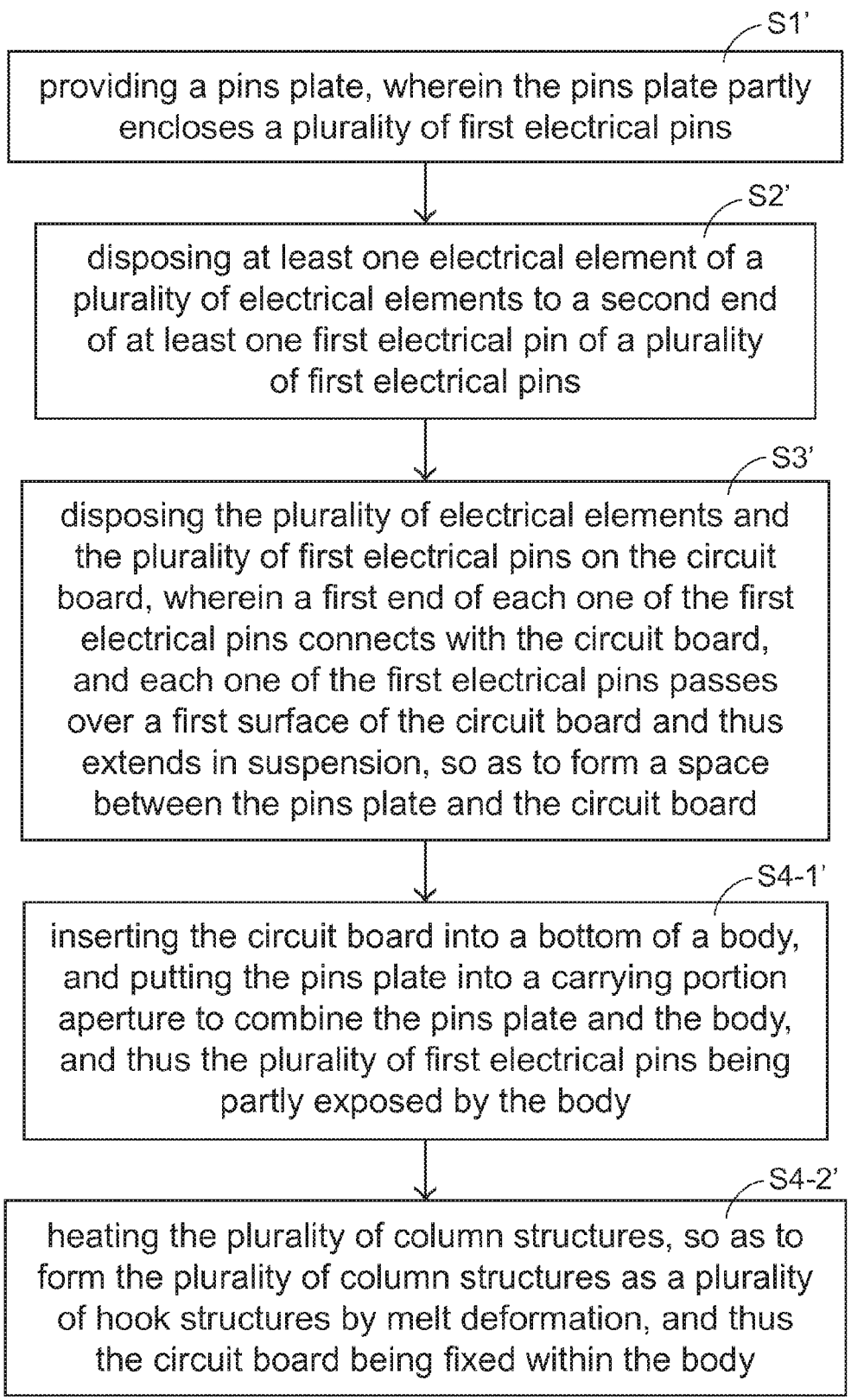
FIG. 12 illustrates a block diagram of a method for assembling a USB application device according to a second preferred embodiment of the present invention.

It should be noted that the method for assembling the USB application device in the present preferred embodiment is different from that of the first preferred embodiment. FIG. 12 illustrates a block diagram of a method for assembling a USB application device according to a second preferred embodiment of the present invention, while FIG. 13A to FIG. 13C illustrate a structural side view of assembling a USB application device according to a second preferred embodiment of the present invention. Referring to FIG. 12 and FIG. 13A to FIG. 13C together, the method for assembling the USB application device 4 comprises the following steps. A step S1' is providing a pins plate 44, wherein the pins plate 44 partly encloses a plurality of first electrical pins 42. A step S2' is disposing at least one electrical element 43 of a plurality of electrical elements 43 to a second end 422 of at least one first electrical pin 42 of a plurality of first electrical pins 42. A step S3' is disposing the plurality of electrical elements 43 and the plurality of first electrical pins 42 on the circuit board 41, wherein a first end 421 of each one of the first electrical pins 42 connects with the circuit board 41, and each one of the first electrical pins 42 passes over a first surface 411 of the circuit board 41 and thus extends in suspension, so as to form a space 46 between the pins plate 44 and the circuit board 41. In addition, a step S4' is disposing the circuit board 41 within the body 40 and combining the pins plate 44 with the body 40, so that the plurality of first electrical pins 42 being partly exposed by the body 40.

In the present embodiment, the step S4' can further comprise a step S4-1' and a step S4-2'. Herein, the step S4-1' is inserting the circuit board 41 into the bottom 404 of the body 40, and putting the pins plate 44 into a carrying portion aperture 4021 to combine the pins plate 44 and the body 40, and thus the plurality of first electrical pins 42 being partly exposed by the body 40. In addition, the step S4-2' is heating the plurality of column structures 405, so as to form the plurality of column structures 405 as a plurality of hook structures 405 by melt deformation for fastening with a plurality of notches 415 of the circuit board 41, and thus the circuit board 41 being fixed within the body 40.

Figure 14:
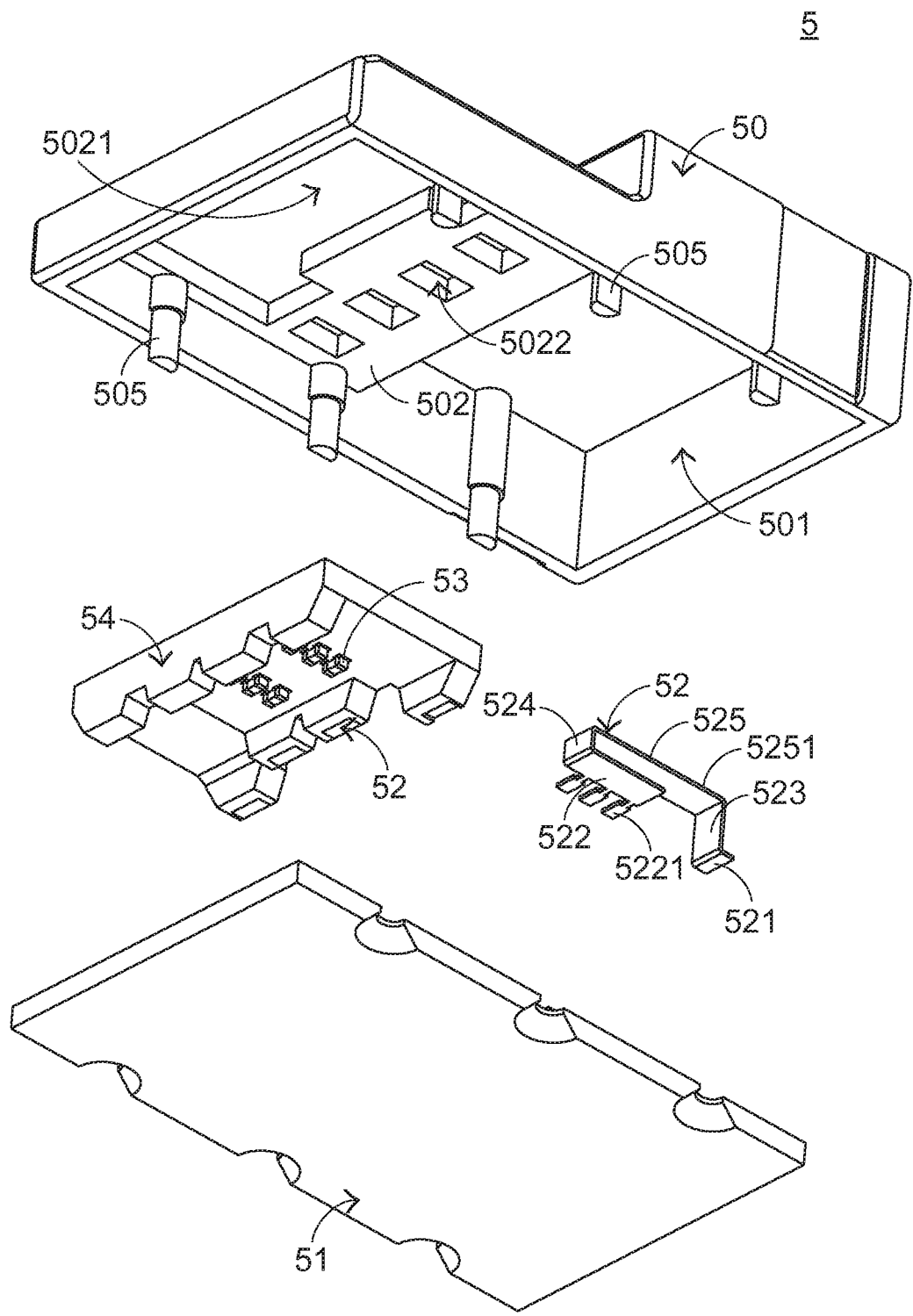
FIG. 14 illustrates a structural explosion view of a USB application device from another angle of view according to a third preferred embodiment of the present invention.
Figure 15:
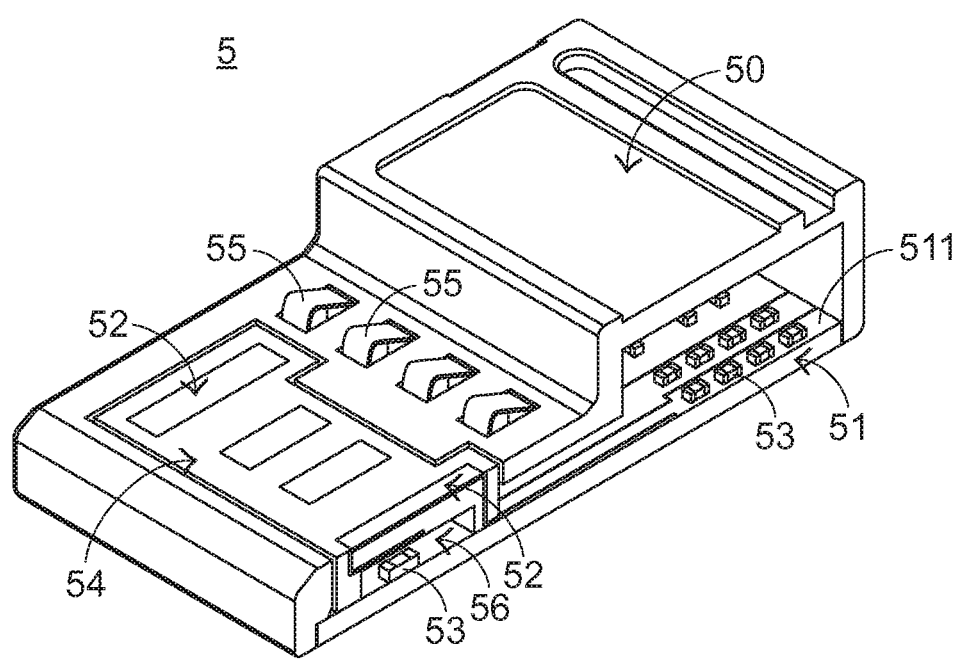
FIG. 15 illustrates a structural cross-sectional view of a USB application device according to a third preferred embodiment of the present invention.
Figure 16:
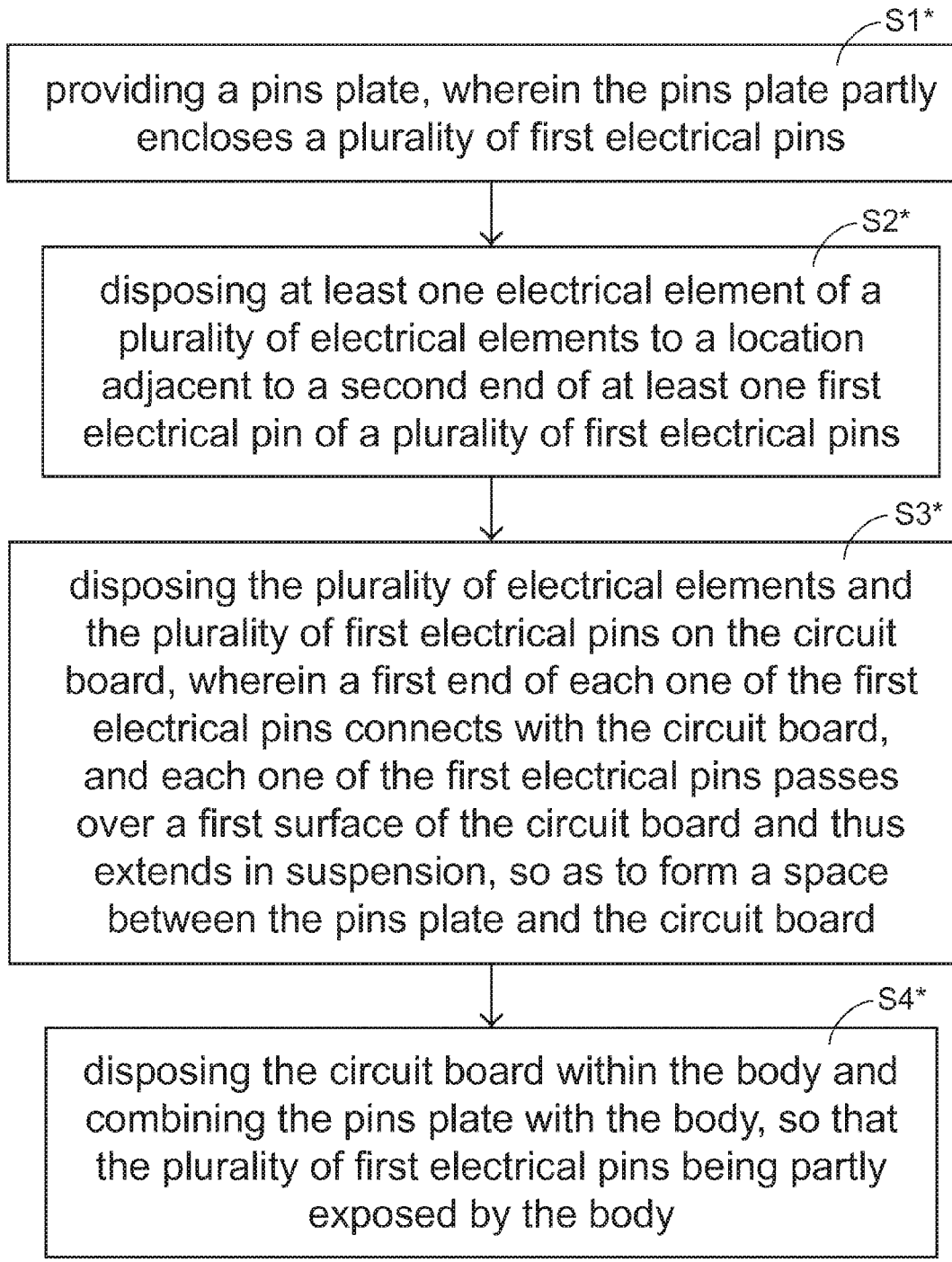
FIG. 16 illustrates a block diagram of a method for assembling a USB application device according to a third preferred embodiment of the present invention.

Furthermore, the present invention further provides a third preferred embodiment. FIG. 14 illustrates a structural explosion view of a USB application device from another angle of view according to a third preferred embodiment of the present invention, and FIG. 15 illustrates a structural cross-sectional view of a USB application device according to a third preferred embodiment of the present invention. Furthermore, FIG. 16 illustrates a block diagram of a method for assembling a USB application device according to a third preferred embodiment of the present invention. Referring to FIG. 14 and FIG. 15 first, the USB application device 5 comprises a body 50, a circuit board 51, a plurality of first electrical pins 52, a plurality of electrical elements 53, a pins plate 54 and a plurality of second electrical pins 55. The body 50 comprises a body opening 501, a carrying portion 502 and a plurality of column structures 505, and the carrying portion 502 comprises a carrying portion aperture 5021 and a plurality of apertures 5022. In addition, each one of the first electrical pins 52 is defined as a first fixing segment 521 (i.e. the first end thereof), an incurvation segment 522 (i.e. the second end thereof), a first extending segment 523, a second extending segment 524 and a contacting segment 525. In a word, the structure of the USB application device 5 of the present preferred embodiment is substantially similar to that of the USB application device 4 of the second preferred embodiment and is omitted herein.

It should be noted that there are three differences between the present preferred embodiment and the second preferred embodiment. First, at least one first electrical pin 52 of the plurality of first electrical pins 52 of the USB application device 5 of the present preferred embodiment further comprises an extending structure 5221, which is protruding from the incurvation segment 522 of the first electrical pin 52 (i.e. the second end thereof), and at least one electrical element 53 of the plurality of electrical elements 53 is capable of being disposed thereon. In a word, the extending structure 5221 is formed by protruding from a side edge of the incurvation segment 522, so that the electrical element 53 disposed on the extending structure 5221 will not be just located under the incurvation segment 522. Therefore, the electrical element 53 can be disposed within a space 56 formed between the pins plate 54 and the circuit board 50, and the electrical element 53 can be disposed on the extending structure 5221 on the first electrical pin 52 as well. As a result, the length of the circuit board 51 can further be reduced due to the location available for disposing the electrical element 53 is increased. In a word, the volume of the USB application device 5 is reduced.

Second, the body 50 of the USB application device 5 of the present preferred embodiment further comprises a plurality of apertures 5022, and the plurality of apertures 5022 are adjacent to the carrying portion aperture 5021 and capable of being passed through by the plurality of second electrical pins 55 correspondingly. As a result, each one of the second electrical pins 55 is partly exposed by the corresponding aperture 5022. Herein, the plurality of first electrical pins 52 form as a USB 2.0 transmission interface, while the plurality of first electrical pins 52 and the plurality of second electrical pins 55 form as a USB 3.0 transmission interface together.

Third, the method for assembling the USB application device 5 of the present preferred embodiment comprises the following steps. A step S1* is providing a pins plate 54, wherein the pins plate 54 partly encloses a plurality of first electrical pins 52. A step S2* is disposing at least a electrical element 53 of a plurality of electrical elements 53 to a location 5221 adjacent to a second end 522 of at least a first electrical pin 52 of a plurality of first electrical pins 52. A step S3* is disposing the plurality of electrical elements 53 and the plurality of first electrical pins 52 on the circuit board 51, wherein a first end 521 of each one of the first electrical pins 52 connects with the circuit board 51, and each one of the first electrical pins 52 passes over a first surface 511 of the circuit board 51 and thus extends in suspension, so as to form a space 56 between the pins plate 54 and the circuit board 51. In addition, a step S4* is disposing the circuit board 51 within the body 50 and combining the pins plate 54 with the body 50, so that the plurality of first electrical pins 52 being partly exposed by the body 50 as illustrated in FIG. 15.

In a word, the method for assembling the USB application device 5 of the present preferred embodiment is substantially similar to the method for assembling the USB application device 4 of the second preferred embodiment, besides replacing the step S2' of the second preferred embodiment by using the step S2*, and the location 5221 adjacent to the second end 522 thereof is the extending structure 5221 formed by protruding from a side edge of the incurvation segment 522.

According to each of the above mentioned preferred embodiments, it is understood that the plurality of first electrical pins form as a stereoscopic structure due to the plurality of first electrical pins of the USB application device of the present invention are bent, and thus a space is formed between the circuit board and the plurality of first electrical pins for disposing the plurality of electrical elements therein or for other purpose. In addition, the electrical element of the USB application device of the present invention can be disposed to a portion of the first electrical pin being incurvated as well, i.e. the incurvation segment. Alternatively, there can further be an extending structure protruding from the incurvation segment, so that the electrical element can be disposed on the extending structure. Thus, in the USB application device of the present invention, the plurality of electrical elements originally disposed to the rear end of the circuit board can be moved to at least one of the three locations include the space between the plurality of first electrical pins and the circuit board, the incurvation segment and the extending structure. Therefore, the rear end of the circuit board does not need to be used anymore and can be omitted, and thus the length of the conventional circuit board can be reduced. As a result, the volume of the receiver can be further reduced.

Moreover, for simplifying the assembling process of the plurality of first electrical pins, in the method for assembling the USB application device of the present invention, the plurality of electrical pins are previously disposed on the pins plate. Therefore, all of the first electrical pins are capable of being disposed on the circuit board by aligning the first electrical pins only one time during the process of combining the plurality of first electrical pins and the circuit board. Herein, the combination of the first electrical pins and the pins plate is designed accurately in order to contact with the plurality of connecting pins of the female connecting socket, and thus the plurality of first electrical pins are not likely to be askew or misaligned. Certainly, the USB application device of the present invention can be used for various fields comprising storage or memory devices (such as flash devices, MP3 players), USB connecting plugs formed by combining with wires, and various receivers, wherein the various receivers comprise wireless mouse receivers, wireless keyboard receivers, Wi-Fi wireless network receivers and so on.

Although specific embodiments of the present invention have been described above, they do not intend to limit the scope of the claims of the present invention. As a result, all of the variations and the modifications equivalent to the specification and the drawings of the present invention should be included within the scope of the claims of the present invention.

What is claimed is:

1. A USB application device capable of fitting into a female connecting socket, wherein the female connecting socket comprises a plurality of connecting pins, and the USB application device comprises:

a body;

a circuit board, disposed within the body;

a pins plate, disposed on the body and exposed outside the body;

a plurality of first electrical pins, a first end of each one of the first electrical pins connecting with the circuit board, passing over a first surface of the circuit board and thus extending toward the pins plate in suspension, and thus the plurality of first electrical pins partly exposed by the pins plate and contacting with the plurality of connecting pins of the female connecting socket, wherein a space is formed between the pins plate and the circuit board; and a plurality of electrical elements, disposed to the first surface of the circuit board, wherein at least one of the plurality of electrical elements is disposed within the space formed between the pins plate and the circuit board.

2. The USB application device as claimed in claim 1, further comprising a case fitting onto the body, so as to form an inserting space between the case and the body.

3. The USB application device as claimed in claim 1, wherein the body comprises:
   a body opening, disposed on a bottom of the body, and thus a second surface of the circuit board exposed by the body opening; and
   a carrying portion, formed by extending from the body toward a front end of the body and having a carrying portion aperture, wherein the carrying portion aperture is capable of receiving the pins plate therein, and thus the pins plate is exposed outside the carrying portion aperture.

4. The USB application device as claimed in claim 3, wherein the body further comprises a hook portion disposed to a front end of the carrying portion and capable of supporting the circuit board, and the hook portion has an incline capable of guiding the circuit board to be put into the body.

5. The USB application device as claimed in claim 1, wherein at least one of the first end and a second end of each one of the first electrical pins is mounted on the first surface of the circuit board by a surface mounted technology or a soldering technology.

6. The USB application device as claimed in claim 1, wherein at least one of the plurality of first electrical pins comprises a first fixing segment, a second fixing segment, a first extending segment, a second extending segment and a contacting segment, the first fixing segment is the first end of each one of the first electrical pins, the second fixing segment is a second end of each one of the first electrical pins, both of the first extending segment and the second extending segment are located between the first surface of the circuit board and the body, a first surface of the contacting segment is exposed by the body, the first surface of the contacting segment is capable of contacting with the connecting pins, a first bending structure is formed between the first extending segment and the contacting segment, a second bending structure is formed between the second extending segment and the contacting segment, the pins plate encloses the first extending segment and the second extending segment, and the pins plate partly encloses the contacting segment.

7. The USB application device as claimed in claim 6, wherein the circuit board comprises a plurality of extending wires, each one of the extending wires corresponds to one of the first electrical pins, both of each one of the first fixing segments and each one of the second fixing segments connect with the circuit board and are adjacent to a front end of the circuit board, each one of the extending wires connects with at least one of the corresponding one of the first fixing segments and the corresponding one of the second fixing segments and disposed along a direction extending toward a rear end of the circuit board, and the extending wires are directly formed on the circuit board.

8. The USB application device as claimed in claim 1, wherein the pins plate partly enclosing the plurality of first electrical pins is formed by an embedded injection molding technology, and thus the pins plate partly encloses the plurality of the first electrical pins.

* * * * *